United States Patent [19]
Connors et al.

[11] 3,971,057
[45] July 20, 1976

[54] LATERAL PHOTODETECTOR OF IMPROVED SENSITIVITY

[75] Inventors: William P. Connors, Florissant; Richard H. Glaenzer, Bridgeton; George A. Saum, Florissant, St. Louis County; Robert G. Wagner, University City, all of Mo.

[73] Assignee: The United States of America as represented by the Secretary of the Navy, Washington, D.C.

[22] Filed: Aug. 21, 1973

[21] Appl. No.: 391,404

[52] U.S. Cl. .............................. 357/30; 250/211 J; 338/18; 357/15; 357/91
[51] Int. Cl.² ......................................... H01L 27/14
[58] Field of Search ............... 250/211 R, 211 J; 307/311; 338/15, 18; 357/30, 15, 91

[56] References Cited
UNITED STATES PATENTS

| 3,207,902 | 9/1965 | Sandborg | 357/30 |
| 3,502,884 | 3/1970 | Perlman et al. | 357/30 |
| 3,548,213 | 12/1970 | Owen et al. | 317/235 UA |
| 3,582,654 | 10/1968 | Meuleman | 357/30 |
| 3,615,929 | 10/1971 | Portnoy et al. | 317/235 UA |
| 3,667,116 | 6/1972 | Felice | 317/235 AY |
| 3,700,978 | 10/1972 | North et al. | 317/235 N |
| 3,704,376 | 11/1972 | Lehovec et al. | 317/235 N |
| 3,761,711 | 9/1973 | Hall | 317/235 N |
| 3,775,191 | 11/1973 | McQuhae | 317/235 AY |
| 3,792,257 | 2/1974 | Gardner et al. | 317/235 N |

Primary Examiner—Maynard R. Wilbur
Assistant Examiner—S. C. Buczinski
Attorney, Agent, or Firm—R. Sciascia; R. Beers; S. Sheinbein

[57] ABSTRACT

A lateral photodetector of improved sensitivity and method of making the same. The photodetector consists of semiconductive wafer, having a transparent layer of metal deposited on its front face to form a Schottky barrier. A negative bias is applied to the Schottky barrier to form a depletion region in the wafer. A low resistivity layer is formed on back of the wafer to which four signal electrodes are attached. Before forming the cell, the semiconductor wafer was exposed to nuclear radiation to increase the responsivity of the cell.

9 Claims, 2 Drawing Figures

LATERAL PHOTODETECTOR OF IMPROVED SENSITIVITY

BACKGROUND OF THE INVENTION

The present invention relates generally to lateral photodetectors and more particularly to a technique for improving the response time and sensitivity of such detectors. The detectors are used in guidance systems to measure the position and intensity of laser energy reflected from a target.

The typical lateral photodetector (LPD) consists of a silicon wafer on which transparent layer of gold is deposited. The deposited gold forms a metal-semiconductor, Schottky barrier on one face of the wafer. On the other face, four signal electrodes are attached to extract the four position-sensitive signals. The four electrodes measure the position and intensity of the laser energy reflected from the target. The linear output of the electrodes is a function of the laser pulse intensity focused on the target and the position of the target with reference to the optical axis of the detector. The linear seekers capable of following such a signal are more accurate than conventional bang-bang seekers presently employed.

The Schottky barrier on the cell is negatively biased during operation. The barrier has the property of allowing optically generated holes to flow out of the cell into the gold barrier, but preventing electrons from the gold from entering the cell. The application of the negative bias to the barrier causes the electrons in the silicon to move away from the barrier, forming a "depletion region," i.e., a region depleted of electrons. As more bias is applied, the thickness of this depleted region grows. The thickness of the region determines the capacitance of the cell; therefore, increasing the thickness of this region, either by increased voltage or by using higher-resistivity silicon, reduces the capacitance of the cell. A reduced capacitance gives a cell with faster response time. In usage, one desires an LPD with a fast response time and a large signal response to optical pulses of light, i.e., a high responsivity.

SUMMARY OF THE INVENTION

The present invention employs two techniques for improving the performance of LPD cells. The new and improved manufacturing technique lowers the resistivity of the face of the cell opposite the Schottky barrier to reduce cell response time, and exposure of the wafer to nuclear radiation results in an increase in the responsivity of the cell. Applying a low resistivity layer to the back face of the wafer or using a relatively thick bulk silicon wafer initially reduces cell response time. Originally, it was expected that using nuclear radiation from $Co^{60}$ would increase the resistivity of silicon wafers leading to increased breakdown voltage, increased responsivity and reduced response time. Surprisingly, only the responsivity of the cell was affected and in a manner not originally expected. Unusually large responsivities were obtained for small bias voltages. Measurements of responsivity, millivolts per centimeter, were made as a function of the bias voltage applied, revealing an unexpected increased linear response region. Thus, exposing the wafer to nuclear radiation during the LPD's formation results in an improved cell.

An object of the present invention is to reduce the response time and increase the responsivity of a lateral photodetector.

Other objects, advantages and novel features of the present invention will become apparent from the following detailed description of the invention when considered in conjunction with the accompanying drawings.

DESCRIPTION OF THE PREFERRED EMBODIMENTS

Figure 1:
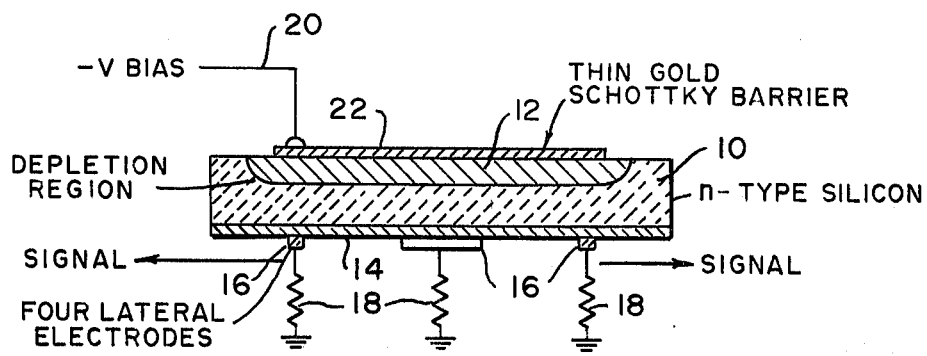
FIG. 1 is a cross section of an LPD constructed in accordance with the present invention.
Figure 2:
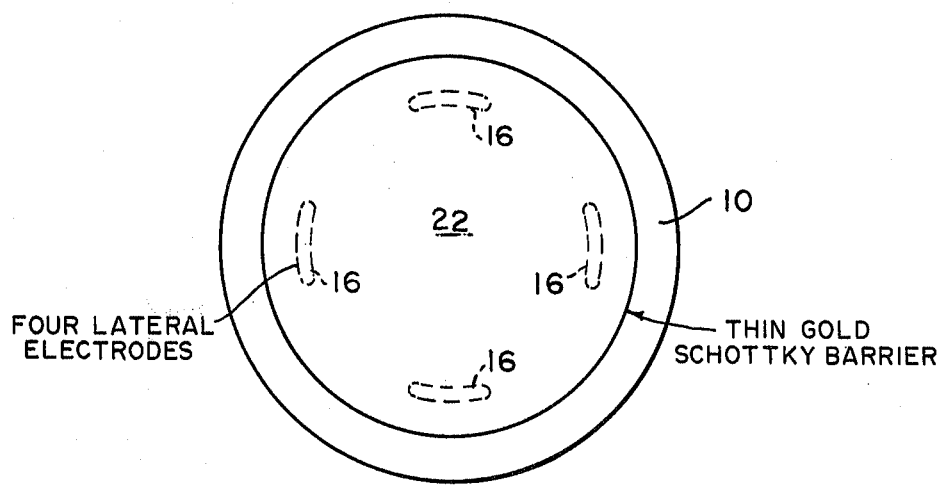
FIG. 2 is a plan view of the LPD shown in FIG. 1.

FIG. 1, which illustrates a preferred embodiment of the invention, shows a cross section of a LPD. The LPD includes a silicon wafer 10, having a low resistivity layer 14 on its back face. Four lateral electrodes 16, only three of which are shown, are attached to the layer 14. Load resistors 18 are connected to the electrodes 16. A thin gold Schottky barrier 22 is on the front face of the wafer 10. Although gold is preferred for the Schottky barrier, other metals such as nickel, platinum, and platinum silicide ($P_tS_i$) may also be employed. A bias lead wire 20 is connected to the front surface of the wafer. A bias voltage is applied through lead wire 20 to produce a depletion layer 12 in the wafer. The depletion layer depth is increased directly by using higher resistivity material and by increasing the applied bias voltage on the layer. FIG. 2 is a plan view of the LPD in FIG. 1, showing the four lateral electrodes 16 on the back face of the LPD in phantom.

The improved LPD of the present invention is made in the following preferred manner. Wafers, preferably of n-type silicon, about one inch in diameter and having a resistivity of a few ohm-cm to a few hundred ohm-cm are cut to a thickness, $t$, for example, 0.080 inches. These wafers are lapped to a thickness of about $0.75t$ using 5 micron lapping compound. The wafers are cleaned using detergents and organic cleaning solvents. The wafers are then exposed to a $Co^{60}$ source for a period of a few hours to a few hundred hours. The optimum time depends on the initial resistivity of the silicon, and the strength of flux from the $Co^{60}$ source. For example, exposing a $Co^{60}$ source producing $3\times10^{11}$ gammas/cm$^2$/sec flux to a silicon wafer having an initial resistivity of 700 ohm-cm changed the resistivity of the wafer to 31,500 ohm-cm after 72 hours of irradiation. After removal from the $Co^{60}$ source, the wafer is again cleaned, its surfaces are acid-etched, and then fabricated into a cell of the physical embodiment shown in FIG. 1.

The gold film or other Schottky barrier can be applied to the front face of the wafer by evaporation, for example. The layer's thickness is preferably about 100 angstroms (A). The contact point between the bias lead wire and the barrier is quite important. The most suitable bonding technique for achieving high reverse bias is indium alloy soldering to the gold film bias contact.

The low resistivity layer applied to the back face of the wafer reduces the lateral resistance through which the signal current must pass to go to the four signal electrodes. In applying the layer, the goal is to provide a relatively high conductive path for the signal electrons to get across the cell to the load resistors 18. The important consideration in this layer is that its impedance must be chosen consistent with the load resistors' resistance, which is determined by the input impedance of the electronic preamplifiers (not shown) to which the LPD is connected. If the impedance is large, the cell will have a slow response; but if the impedance is much smaller than the resistance of the load resistors, the lateral effect will be lost, and no position information can be obtained from the cell. Typical values of layer impedance for matching with present day preamplifiers are between a few hundred and a few thousand ohms, measured between diametrically opposite lateral electrodes.

Four methods may be employed to form the low resistivity layer 14 on the back face of the cell to reduce response time. In the first, a thin conductive layer is applied by diffusion of phosphorous for n-type silicon or boron for p-type silicon. Silicon of the n-type, however, is preferred. To preserve the lateral effect, the layer should be less than one tenth of the wafer thickness. Enough phoshorous dopant should be diffused into this layer to produce a few hundred ohms per square sheet resistance.

In a second procedure a thin, resistive-metal sheet may be evaporated on to the wafer to form the low resistivity layer 14. Nichrome, chromium, or any stable metal capable of giving a few hundred ohms per square sheet resistance may be employed to form the metal sheet. The metal should be a few tens to a few hundred Angstroms thick to produce a few hundred ohms per square sheet resistivity.

In a third procedure an epitaxial layer is deposited on the rear face to form the low resistivity layer 14. The epitaxial layer is doped silicon. Phosphorus dopant would be used on n-type silicon. Again, the upper limit on layer thickness would preferably be about one tenth the wafer thickness. Typical layers would be much thinner than this, such as 10 microns thickness, and with sufficient phosphorus dopant to produce a layer with a few hundred ohms per square sheet resistance. Other materials which provide a low impedance contact to the silicon and a sheet resistivity of a few hundred ohms per square sheet could also be employed to form the layer. An example would be a mixture of chromium and silicon monoxide.

A fourth way of forming a low resistivity layer without really applying a distinct layer of material to the wafer is to start with a thicker than normal wafer to begin with. The thickness of the cell before adding any back layer, as in the first three examples, was typically 0.010 to 0.020 inches. depending on sensitivity requirements and breakdown voltage. The preferred thickness of a silicon wafer with a resistivity of 1000 to 2000 ohm-cm, employing this fourth procedure, is 0.060 to 0.070 inches. However, the important requirement is that the thickness be greater than the depletion depth when the bias voltage is applied. The depletion depth is the distance the depletion layer 12 extends into the wafer. When the cell is thin, as in the first three procedures, the depletion layer extends through the entire layer at relatively low voltages. By increasing the thickness of the wafer, one, in effect, produces a bulk silicon layer which serves as a low resistivity layer. The same result can be achieved in relatively thin wafers by reducing the bias voltage. However, the wafers should be at least 0.01 inches.

The four lateral electrodes 16 may be connected to the wafer by ultrasonic wire bonding. Moreover, other semiconductor materials on which the barrier can be formed such as gallium arsenide and indium arsenide could be employed to form the wafer. The bias voltage applied to the LPD's ranges from ten or less to several hundred volts. The optimum amount of bias voltage will vary from cell to cell and for particular systems in which the cell is used. For example, using a relatively thick n-type silicon, 0.070 inch, with resistivity of 1500–2000 ohm-cm and electrode separation of 10mm, a reverse bias voltage of 500 volts was found to be a suitable bias voltage, when reading emissions from a 1.06 $\mu$ light emitting diode.

Obviously, many modifications and variations of the present invention are possible in light of the above teachings. It is therefore to be understood that, within the scope of the appended claims, the invention may be practiced otherwise than as specifically described.

What is claimed is: pg,12

1. In the process of making a lateral photodetector including the steps of applying a Schottky barrier to one face of a semiconductor wafer, connecting a lead wire to the Schottky barrier, and connecting four electrodes to the opposite face of said wafer, the improvement comprising:
   lowering, isotropically, the lateral resistivity of the opposite face of the semiconductor wafer; and
   exposing said wafer to a source of nuclear radiation for a predetermined period before applying the Schottky barrier.

2. The process of claim 1 wherein the step of lowering the resistivity of the opposite face comprises diffusing a conductive layer of material on the opposite face.

3. The process of claim 2 wherein the semiconductor wafer is n-type silicon and the conductive layer is phosphorous-doped.

4. The process of claim 1 wherein the step of lowering the resistivity of the opposite face comprises evaporating a resistive-metal sheet onto said opposite face.

5. The process of claim 1 wherein the step of lowering the resistivity of the opposite face comprises depositing an epitaxial layer on said opposite face.

6. The process of claim 1 wherein the step of lowering the resistivity of the opposite face comprises applying a bias voltage to the lead wire to create a depletion region in the wafer that is spaced from said opposite face.

7. The process of claim 6 wherein the wafer is n-type silicon with a resistivity of 1000 to 2000 ohm-cm and a thickness of 0.060 to 0.070 inches.

8. The process of claim 1 wherein the wafer is n-type silicon.

9. A lateral photodetector comprising:
   an n-type silicon semiconductor wafer;
   a Schottky barrier on one face of the wafer;
   a lead wire connected to the Schottky barrier for applying a negative bias to the barrier and creating a depletion region in the wafer;
   a low resistivity layer of an evaporated, resistive-metal sheet on the other face of said wafer, the lateral resistivity of said layer being isotropic, said metal selected from the group consisting of nichrome and chromium; and
   four electrodes connected to said low resistivity layer.

* * * * *